United States Patent [19]
Hiller et al.

[11] Patent Number: 4,550,309
[45] Date of Patent: Oct. 29, 1985

[54] ANALOG TO DIGITAL CONVERTER

[75] Inventors: Donald R. Hiller, Lake Stevens; Charles Kingsford-Smith, Mukilteo, both of Wash.

[73] Assignee: Hewlett Packard Company, Palo Alto, Calif.

[21] Appl. No.: 580,584

[22] Filed: Feb. 16, 1984

[51] Int. Cl.⁴ ............................................ H03K 13/17
[52] U.S. Cl. ...................... 340/347 AD; 340/347 DD
[58] Field of Search ................. 340/347 AD, 347 DA

[56] References Cited
U.S. PATENT DOCUMENTS

| | | | |
|---|---|---|---|
| 3,244,808 | 4/1966 | Roberts | 358/133 |
| 3,508,152 | 4/1970 | Sivertson, Jr. | 325/38 B |
| 3,562,420 | 2/1971 | Thompson | 325/42 |
| 3,999,129 | 12/1976 | Kasson | 340/347 AD |

Primary Examiner—Bernard Roskoski
Attorney, Agent, or Firm—Leslie G. Murray; William H. MacAllister

[57] ABSTRACT

In a standard residue class analog-to-digital converter, pseudo-random noise is introduced at first or subsequent approximations of an analog input signal by the local digital-to-analog converter.

2 Claims, 5 Drawing Figures

ANALOG TO DIGITAL CONVERTER

BACKGROUND AND SUMMARY OF THE INVENTION

As shown in FIG. 1, the use of pseudo-random noise (PRN) as a dither signal for enhancing linearity of an analog-to-digital converter (ADC) by diffusing non-linearities and discontinuities arising during signal conversion is well known. See, for example, the publication entitled "8 Bit A-D Converter Has 12 Bit Linearity" in *Electronics*, dated Sept. 11, 1980, at pp. 171-172. PRN is subtracted from the input analog signal at junction 44 after conversion by DAC 43. PRN is removed from the output of internal ADC 41 at junction 42. ADC 41 is a typical successive approximation ADC of the type shown in FIG. 2.

Referring to FIG. 2, ADC 41 comprises summer 20 for substracting signals from DAC 23 from the analog input, comparator 21 to determine if the output of summer 20 is above or below ground, Successive Approximation Logic (SAL) 22 and DAC 23. SAL 22 tries each bit of the DAC 23 in turn (successively), starting with the most significant. The most significant bit produces an analog output of $V_{REF}/2$, the next bit $V_{REF}/4$ and so on with each successive bit ½ the value of the previous bit. If the output of the DAC is greater than the analog input, SAL 22 resets this bit while setting the next bit. If the ouput of DAC 23 is less than the analog input, the bit is not reset. The conversion is complete when the last bit of DAC 23 is tested.

In order to add dither to the successive approximation ADC of FIG. 1, it was necessary to add DAC 43 to convert digital PRN from source 17 to an analog signal. DAC 23 of ADC 41 could not be used for such conversion because it can convert only one digital signal at a time. Therefore, if PRN is added, an uncorrectable conversion error would result.

In the general residue class ADC of FIG. 3, an analog input signal is converted to a digital word by successive "passes" or closer approximations. During the first-pass, ADC 62 converts the input signal from amplifier 61 to a few digital bits which are stored in latch 66. During the second-pass, DAC 14 converts the first-pass approximation back to an analog signal which is then subtracted (added negatively) from the input signal at junction 60. The difference left, or "residue", represents the error in the first-pass conversion. The gain of amplifier 61 is then increased, and the residue is converted to a few bits by ADC 62 and combined by adder 64 with the first-pass conversion to produce a much more accurate approximation of the input signal. Two or more passes, each of which producing any number of bits, can be performed. DAC 14 corresponds at least functionally to DAC 23 of ADC 41.

In a residue class ADC converter, each successive pass improves the linearity of the converter up to the accuracy limit of DAC 14. Thus, if the time allowed for conversion of the signal and the accuracy of DAC 14 permit, three or more passes may improve linearity even more.

In the present invention, PRN is introduced via the DAC already presented in a residue class ADC and may be introduced during either first or subsequent passes. For first-pass introduction, the analog signal is stored by a sample and hold circuit prior to first-pass digitization thereof. A sample value of PRN is introduced to the input of a DAC. The corresponding analog PRN is then subtracted from the sample and hold output and the result is digitized as the first approximation. The first approximation is then subtracted from the sample and hold output and the result of that subtraction, known as the residue, is again digitized by the ADC. Finally, this second-pass approximation is added to the first-pass approximation which was previously stored to produce a final output.

For subsequent-pass introduction, the first-pass digitization contains no PRN. PRN, instead, is added to the first-pass approximation to become the input to the DAC during the second-pass approximation. In both configurations, all of the dither is subtracted and only the digitized sample and hold output is present, with linearity enhanced by the presence of PRN during conversion.

The primary advantage of the first-pass PRN configuration is that the first approximation is more linear. The disadvantage, however, is that full-scale range of the first-pass is reduced, as is the case for previously published schemes. With the subsequent-pass PRN configuration of the present invention, however, the full-scale range of the total conversion is not reduced.

DESCRIPTION OF THE PREFERRED EMBODIMENT

Figure 1:
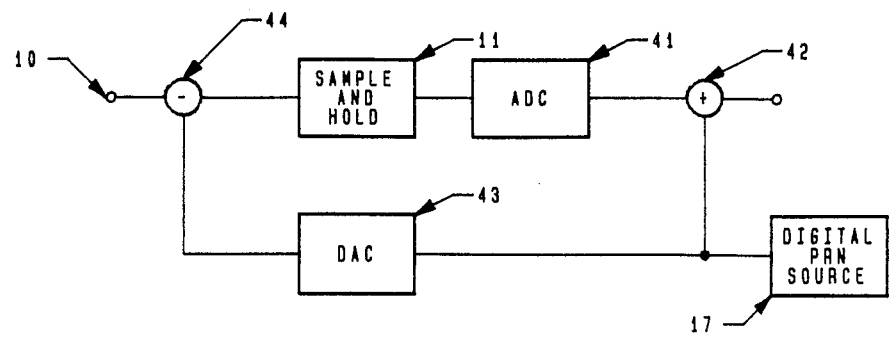
FIG. 1 is a block diagram of a successive-approximation ADC according to the prior art.
Figure 2:
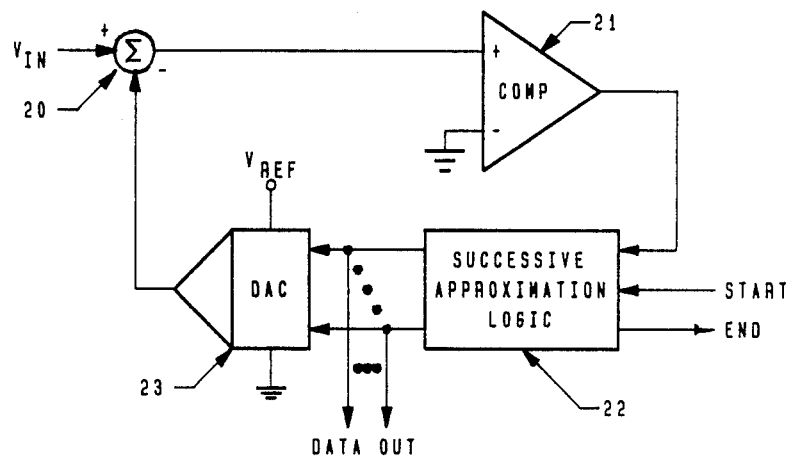
FIG. 2 is a block diagram of ADC 41 of FIG. 1.
Figure 3:
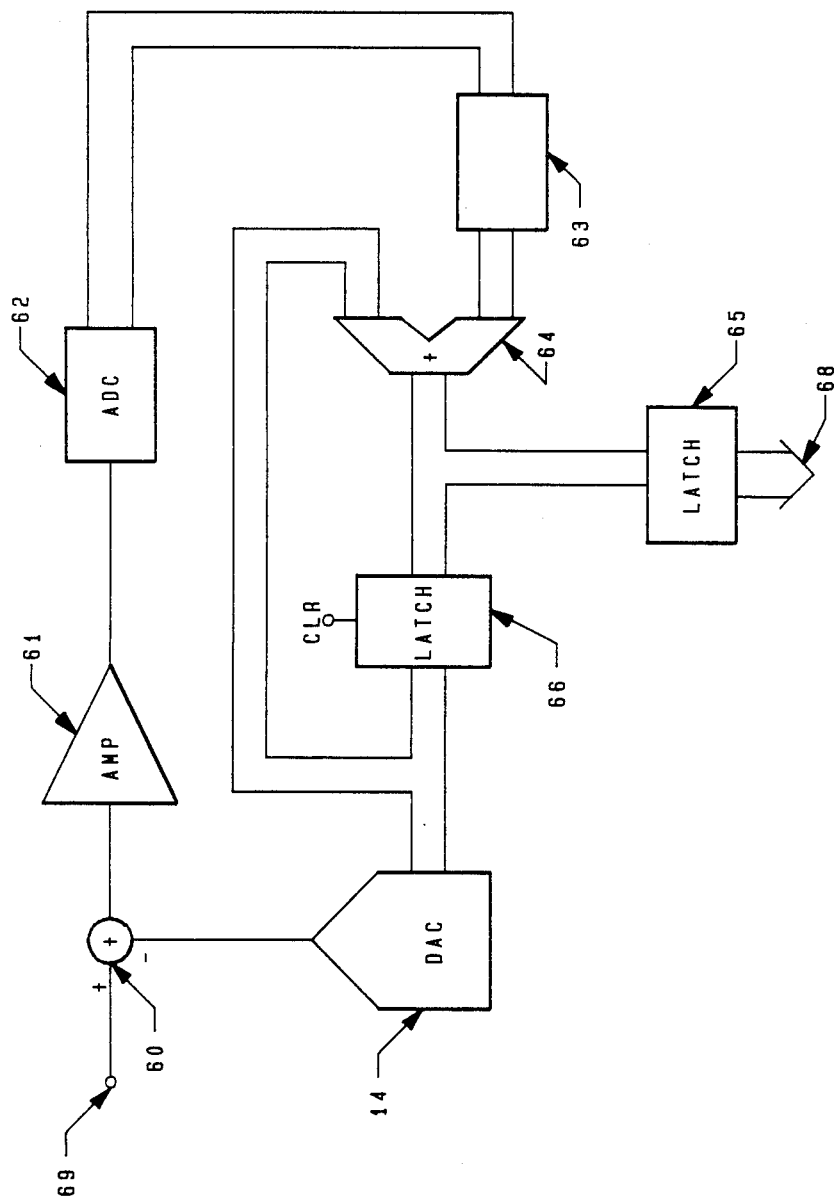
FIG. 3 is a block diagram of a prior art general residue class ADC.
Figure 4:
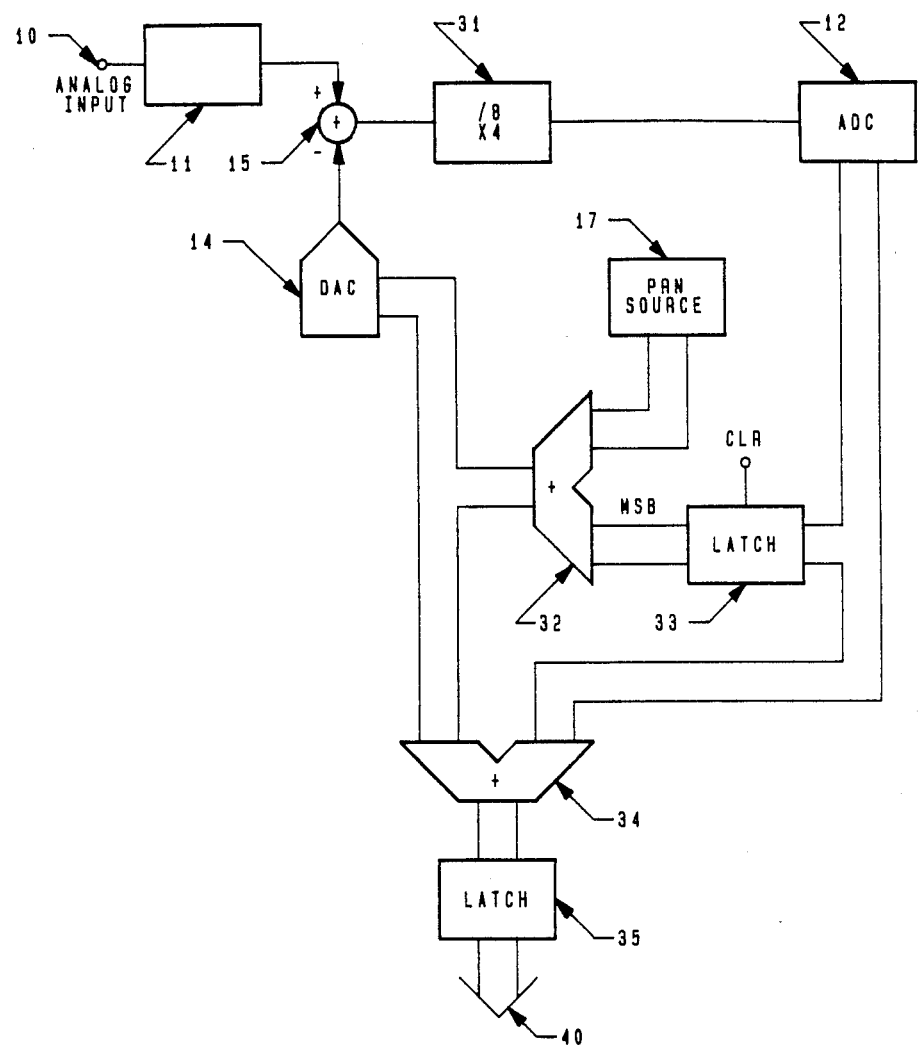
FIG. 4 is a block diagram of one embodiment of an ADC constructed in accordance with the principles of the present invention.

Referring to FIG. 4, an analog input signal is stored by sample and hold circuit 11. Since latch 33 is cleared, only PRN signal passes through adder 32 to DAC 14. Analog PRN is then effectively subtracted from the signal at the input of amplifier 31. Thus, the output of sample and hole 11 combined with analog PRN passes to ADC 12 through amplifier 31. The gain of amplifier 31 is set to divide input signals by 8 during first-pass approximation.

The first-pass approximation from ADC 12 is received by latch 33, which is applied to the input of adder 32. The output of adder 32 is the digitized output signal of sample and hold 11 plus a small amount of PRN signal. The small amount of PRN signal is the residue of the original PRN signal after it has also been digitized during its pass through ADC 12. It should be noted that the PRN signal applied to adder 32 through latch 33 is substantially out of phase with respect to the signal from PRN source 17 and is subtracted from the input analog signal at junction 15. The resultant signal comprises the first-pass approximation of the system of the present invention.

The first-pass approximation is then subtracted from the output of sample and hold 11 at junction 15 and the residue signal left passes through amplifier 31 to ADC 12. The gain of amplifier 31 is now set to multiply by 4 for this second-pass of signal processing. ADC 12 digitizes the residue signal which is then shifted by 5 bits to compensate for amplification and added to the first-pass aproximation signal by adder 34 to produce a final output through latch 35.

Each pass of the ADC digitizes the analog signal to an accuracy of 8 bits. Similarly, the residue is converted to an accuracy of 8 bits but since the resolution of this converter is 13 bits, there is an "overlap" of 3 bits per pass.

Overlap refers to the fact that the subsequent-pass 8-bit output of ADC is shifted 5 bits from the first-pass output to provide 13-bit "resolution" or sensitivity of the final output digital signal representing the input analog signal. Thus the three least significant bits (LSB's) of the first-pass approximation overlap and are combined with the three most significant bits (MSB's) of subsequent-pass approximations. Of course, the five MSB's of the first-pass approximation may also be affected if there is carry-over from combining overlapped bits.

Two LSB coubts of the first-pass approximation are used to introduce PRN into the ADC of the present invention. Thus, in linear terms, 25% of the overlap is used.

The overlap of 3 bits per pass present in the present invention facilitates introduction of PRN into approximations of the input analog signal by DAC 14. DAC 14 corresponds functionally to DAC 23 of ADC 41.

Since the PRN at the output of adder 32 is of opposite phase to the PRN signal which is quantized by ADC 12, all of the PRN is eliminated and only digitized signals from sample and hold 11 are presented at output 40. The linearity of conversion by ADC 12 has thus been enhanced by the presence of PRN signals during conversion only.

The manner by which conversion process of the present invention improves the overall ADC linearity may be understood by assuming that the input signal is slowly varying in the vicinity of a value for which the ADC exhibits a significant jump or discontinuity. That is, the ADC produces a value which differs by more than one bit from the previous lower or higher signal. In addition, the ADC may have hysteresis, i.e. successive conversions from slowly increasing signals may not match those from slowly decreasing signals. The technique described herein reduces the deleterious effect of such ADC anomalies by producing, for a given value of input signal, a sequence of conversions derived from a neighborhood around that signal value. Erroneous conversions from ADC anomalies may then be averaged with correct conversions, and the effect of the anomalies is diluted, usually in proportion to the size of the neighborhood, which corresponds to the PRN signal magnitude.

Figure 5:
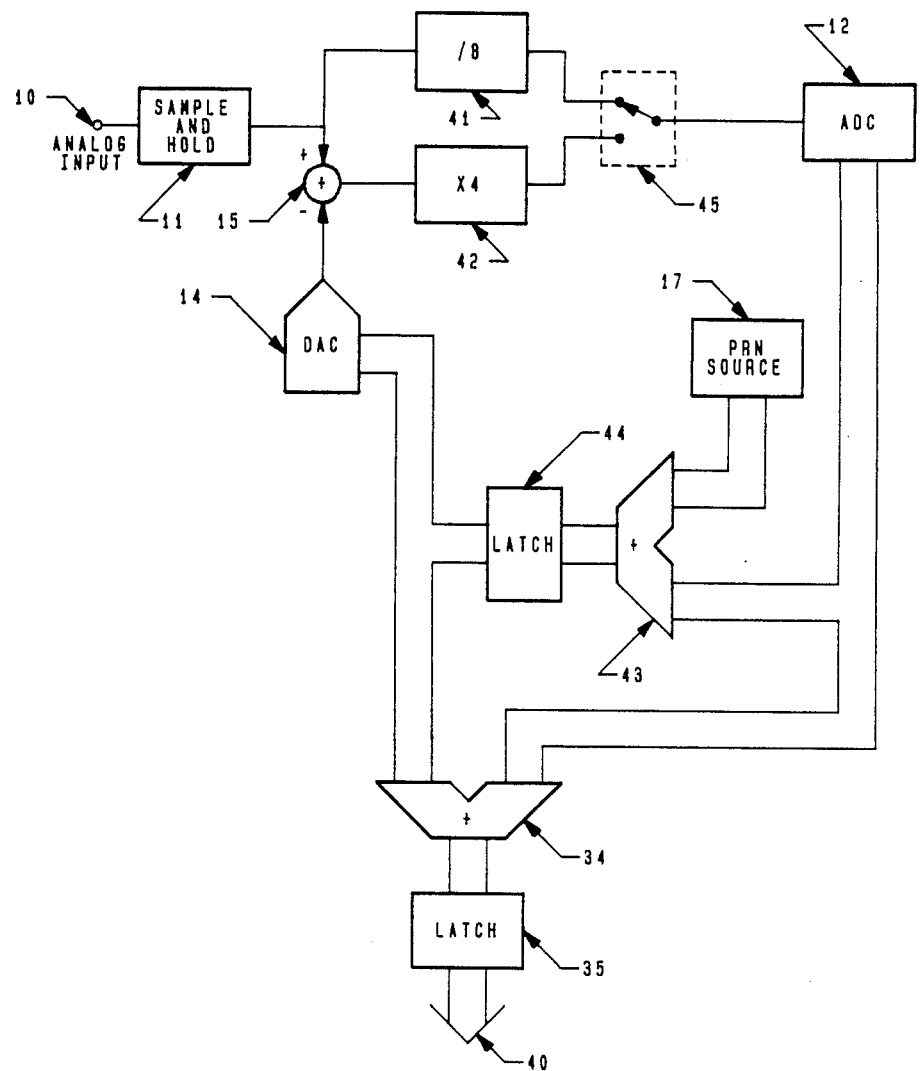
FIG. 5 is a block diagram of another embodiment of an ADC of FIG. 4.

Referring now to FIG. 5, in this configuration, the first-pass approximation of signals stored in sample and hold circuit 11 includes no PRN. PRN is added to the first-pass approximation by adder 43 to become the input to DAC 14 during the second-pass approximation. Switch 45 transmits signals divided by 8 from amplifier 41 to local ADC 12 during first-pass approximation, then transmits signals multiplied by 4 from amplifier 42 during second-pass approximation. PRN is later removed from the output digitized signal in the same manner as described for the configuration of FIG. 4.

Referring now to FIGS. 4 and 5, sample and hold circuit 11 is a standard sample and hold circuit with sufficient linearity, aperture jitter, and acquire time to enable the residue converter to meet its accuracy and speed specifications. Local ADC 12 is a fast 8 bit ADC such as the TRW TDC 1001 J. DAC 14 is a fast, 14 accurate DAC such as Burr-Brown DAC702KH. PRN source 17 comprises standard logic equivalent to a 15 bit exclusive-or feedback shift register clocked 8 times between conversion cycles. Adders 32, 34 and 43 are standard logic adders of which Texas Instruments 74LS283N is a typical example. Latches 33, 35 and 44 are standard logic flip-flops of which Texas Instruments 74LS273 is a typical example. Amplifiers 31, 41 and 41 comprise fast operational amplifiers such as Harris HA-2625 together with precision resistors.

Since DAC 14 is already required for operation of the standard residue ADC of FIGS. 4 and 5, the present invention makes further use of that DAC to further enchance linearity by the introduction of PRN.

We claim:

1. Apparatus for converting an input analog signal into a substantially equivalent digital signal, said apparatus comprising:
   a source of pseudo-random noise;
   an analog-to-digital converter including a digital-to-analog converter for producing a plurality of digital approximations of the input analog signal;
   a first adder for coupling signals from the source of pseudo-random noise to the digital-to-analog converter for producing an analog noise signal, in opposite phase to the input analog signals for combining said analog noise signal with the first digital approximation of the input analog signal, and for coupling said combined noise and first digital approximation signal to said analog-to-digital converter to produce a second digital approximation signal; and
   a second adder coupled to the analog-to-digital converter and to the first adder for combining the first digital approximation with the second digital approximation to produce a digital signal which is substantially equivalent to the input analog signal.

2. Apparatus as in claim 1 wherein the first adder further includes latch means for selectively adding signals from the source of psuedo-random noise to the second and subsequent approximations of the input analog signal by the analog-to-digital converter.

* * * * *